United States Patent [19]

Kikuchi et al.

[11] 4,341,834
[45] Jul. 27, 1982

[54] COATED SUPER-HARD ALLOY ARTICLES

[75] Inventors: Noribumi Kikuchi, Omiy a; Yasuo Suzuki, Ageo; Taijiro Sugizawa; Fumio Washizu, both of Tokyo, all of Japan

[73] Assignee: Mitsubishi Kinzoku Kabushiki Kaisha, Tokyo, Japan

[21] Appl. No.: 9,737

[22] Filed: Feb. 5, 1979

Related U.S. Application Data

[63] Continuation of Ser. No. 813,774, Jul. 7, 1977, abandoned.

[30] Foreign Application Priority Data

Jul. 10, 1976 [JP] Japan .................................. 51-82261

[51] Int. Cl.$^3$ ................................................ B32B 7/02
[52] U.S. Cl. ..................................... 428/216; 427/249; 427/255.3; 427/255.7; 428/336; 428/469; 428/472; 428/627
[58] Field of Search ............... 148/31.5; 428/627, 632, 428/633, 622, 623, 469, 472, 539, 334-336, 216; 473/417; 427/248.1, 255.1-255.7, 249

[56] References Cited

U.S. PATENT DOCUMENTS

| | | | |
|---|---|---|---|
| 3,736,107 | 5/1973 | Hale | 428/332 |
| 3,802,933 | 4/1974 | Rausch et al. | 148/31.5 |
| 3,836,392 | 9/1974 | Lux et al. | 148/6.3 |
| 3,837,894 | 9/1974 | Tucker, Jr. | 148/31.5 |
| 4,018,631 | 4/1977 | Hale | 148/31.5 |
| 4,026,730 | 5/1977 | Van Thyne et al. | 148/31.5 |
| 4,035,541 | 7/1977 | Smith et al. | 148/31.5 |
| 4,052,530 | 10/1977 | Fonzi | 428/469 |
| 4,162,338 | 7/1979 | Schintlmeister | 427/255.7 |

FOREIGN PATENT DOCUMENTS

| | | | |
|---|---|---|---|
| 2106103 | 9/1972 | Fed. Rep. of Germany | 427/248 J |
| 2233699 | 1/1973 | Fed. Rep. of Germany | 148/31.5 |
| 2233700 | 1/1973 | Fed. Rep. of Germany | 148/31.5 |
| 2317447 | 10/1974 | Fed. Rep. of Germany | 427/248.1 |
| 2528255 | 2/1976 | Fed. Rep. of Germany | 427/255.7 |
| 2357321 | 3/1978 | France | 428/627 |
| 48-59106 | 8/1973 | Japan . | |

OTHER PUBLICATIONS

Nishimura, H., et al.; Nippon Kinzoku Gakkais:, (J. Japan Inst. Met.), No. 10, 1956, pp. 589-592.
Carson, W., et al., Annals of the CIRP, vol. 23, 1, pp. 25-26, (1974).
Negishi, H., et al., "Study on Mechanism of Wear of Surface Coated Super Hard Alloys", Preprints for the Spring Convention of 1976 of Seiki Gakkai, (Precision Machinery Institute).
Kieffer, R., et al., Hart Mettlle, MIT 236, Springer-Verlag, Wien-New York, pp. 1-19, 418-419, (1965).
Storms, E. K., The Refractory Carbides, vol. 2, Academic Press, 10, 11, 236, 237, TN677585, (1967).
Voitovich, R. F., et al., Poroshkovaya Metallurgiya, No. 2 (10), pp. 63-68, Feb. 1972.
Stewart, R. W., Journal of the American Ceramic Society, vol. 50, No. 4, pp. 176-181, 4/1967.
Kikuchi, N., et al.; "Titanium Oxycarbide Coatings Ura CUD Method", Chemical Vapor Deposition 1977, vol. 77-5, Electrochemical Society Proceedings.
Reichle, M., et al., Journal of the Less-Common Metals, The Netherlands, vol. 27, pp. 213-235, (1972).
Donaghey, L. F., et al., ed., "Proceedings of the Sixth International Conference on Chemical Vapor Deposition 1977", vol. 77-5, The Electrochemical Society Inc., Princeton, N.J., pp. VI-XI, 403-416.

Primary Examiner—Michael L. Lewis
Attorney, Agent, or Firm—Wenderoth, Lind & Ponack

[57] ABSTRACT

A cutting tool or a wear-resistant mechanical part comprises: a substrate of WC, Co, TiC, and TaC with or without an inner coating layer of TiC, TiN or TiCN; an intermediate layer of a titanium oxycarbide formed on the surface of the substrate or the inner coating layer by carrying out a reaction thereon at a temperature of 800° to 1,200° C. of a halide of titanium, hydrogen, and carbon monoxide or carbon dioxide or a mixture thereof; and an outer coating layer of aluminum oxide formed on the outer surface of the intermediate layer. The thicknesses of the inner layer, the intermediate layer, and the outer coating layer are of the order of 0.5 to 20 microns, 0.5 to 20 microns, and 0.5 to 10 microns, respectively.

4 Claims, 6 Drawing Figures

COATED SUPER-HARD ALLOY ARTICLES

This is a continuation of application Ser. No. 813,774, filed July 7, 1977, now abandoned.

BACKGROUND OF THE INVENTION

This invention relates generally to metal alloys and composite materials having hard coverings thereon. More particularly, the invention relates to articles of cemented carbide, sintered hard alloys, and the like (hereinafter referred to as "super-hard alloys") for cutting purposes and for abrasion or wear resistant mechanical parts, which articles have thin coating layers with excellent abrasion resistance. The invention relates also to a process for producing coated super-hard alloy articles of the above described character.

Heretofore, the practice of covering the working or functional surfaces of super-hard alloy articles with a single layer or multiple layers of various carbides, nitrides, and carbonitrides of group 4a, 5a, and 6a metals of the periodic table, such as titanium carbide and titanium nitride, and/or oxides such as aluminum oxide and zirconium oxide for the purpose of improving the abrasion resistance of these articles has been known. Such coated super-hard alloy articles have been widely reduced to practice as throw-away tips for cutting purposes. Titanium carbide is most widely used as a coating material and, in comparison with the super-hard alloy, itself, has superior properties for the function of a cutting tool such as resistance to oxidation, lubrication property, affinity for iron, and hardness.

However, a super-hard alloy coated with titanium carbide exhibits, as a cutting tool, an excellent performance in resisting flank abrasion, but, on the other hand, the abrasion resistance at the rake face is deficient. This gives rise to a shortening of the serviceable life of the tool.

As a measure for overcoming this problem, the coating of the surfaces of the alloy with aluminum oxide would appear to be suitable. However, coating a super-hard alloy or a covering layer such as titanium carbide with aluminum oxide is not practical since the affinity of the two materials for each other is weak as described hereinafter, and a strong bond cannot be achieved.

As a result of our studies relating to this problem, we have succeeded in solving this problem and have obtained coated super hard alloy articles of excellent resistance to rake face wear by causing a titanium oxycarbide to form on the surface of a super-hard alloy, or a super-hard alloy coated with titanium carbide, by a specific process described hereinafter and forming an aluminum oxide layer on the titanium oxycarbide. We have discovered that by this method, coated super-hard alloy articles of excellent rake face wear resistance can be produced.

Regarding the properties of and research on applications of titanium oxycarbides, the following particulars are known.

1. TiC and TiO have the same crystalline structure (cubic NaCl type) and exist in the form of solid solutions of all proportions as titanium oxycarbide ($TiC_xO_y$). It is known that the melting point and the lattice constant vary in a continuous manner with the proportions of the C and O. Cf. Reference (1). identified at the end of this specification;

2. As the proportion of the O increases, the free energy of formation of the $TiC_xO_y$ decreases, and the $TiC_xO_y$ becomes a chemically stable compound. According to Carson et al, the lower the free energy of formation is, the greater is the wear resistance of the carbide at high cutting speeds in the case where it is used as a coating on a cutting tool. Cf. Reference (2)

3. The application of $TiC_xO_y$ to cutting tools has already been tried. For example, Carson et al have reported their forming samples of $TiC_xO_y$ by hot pressing mixtures of TiC and TiO powder in various proportions, applying these as coatings onto tool surfaces by RF sputtering, subjecting the tools thus coated to cutting test, and finding that the resulting wear resistance of these tools is approximately three times that of the super-hard tool alloys prior to coating. Cf. Reference (3).

However, sputtering is not adaptable to mass production, produces a weak bond between the coating layer and the super-hard alloy substrate, and can form a coating in only one direction, thus being accompanied by several problems in actual practice.

Another method of forming $TiC_xO_y$ by covering a super-hard alloy of large TiC content with TiO thereby to cause the TiO to diffuse at an elevated temperature is known, but this method is not satisfactory since it forms complex compounds of other metals contained in the super-hard alloy. Cf. Reference (3). Furthermore, in the case where TiC is applied as a coating and is then oxidized, although a portion thereof becomes $TiC_xO_y$, $TiO_2$ is readily formed, and the wear resistance of the resulting article is lower than that in the case of TiC.

Thus, while the expedient, per se, of coating super-hard alloys with $TiC_xO_y$ is known, none of the above described known methods have been industrially feasible and have not been developed to practical use.

SUMMARY OF THE INVENTION

It is an object of this invention to provide coated super-hard alloy articles which are not accompanied by the aforedescribed problems of known articles of like kind, and which have excellent properties, particularly high resistance to rake face wear when used in the form of cutting tools.

Another and specific object of this invention is to provide articles of super-hard alloys each coated with laminated layers of coatings comprising an intermediate layer of a titanium oxycarbide on the surface of the super-hard alloy substrate and an outer layer of aluminum oxide on the titanium oxycarbide layer or comprising an inner layer of titanium carbide (or nitride or carbonitride) on the surface of the alloy substrate, an intermediate layer of a titanium oxycarbide on the titanium carbide layer, and an outer layer of aluminum oxide on the titanium oxycarbide layer.

Still another object of this invention is to provide industrially practical processes for producing coated super-hard articles as described above.

As a result of our search for a method of applying a coating of a $TiC_xO_y$ firmly on the surface of a super-hard alloy, titanium carbide, or some other material by a chemical vapor depositing process which is industrially feasible, we have discovered (1) that $TiC_xO_y$ can be formed directly by causing a halide of titanium to react with hydrogen and carbon monoxide and/or carbon dioxide at a high temperature of 800° to 1,200° C. on the surface to be coated and (2) that, in comparison with $TiC_xO_y$ coatings known heretofore, the coating layer thus obtained exhibits superior performance and, moreover, has a great affinity for aluminum oxide, whereby a strong bond is established therebetween.

According to this invention in one aspect thereof, briefly summarized, there are provided coated super-hard alloy articles each comprising: a substrate of a super-hard alloy comprising at least one compound selected from carbides, nitrides, and carbonitrides of metals of Groups 4a, 5a, and 6a of the periodic table and at least one metal selected from Fe, Ni, Co, W, Mo, and Cr; an intermediate layer of a titanium oxycarbide of a thickness of 0.5 to 20 microns formed on the surface of the substrate by a reaction thereon at a temperature of 800° to 1,200° C. of a halide of titanium, hydrogen, and carbon monoxide, carbon dioxide, or a mixture thereof; and an outer coating layer of aluminum oxide of a thickness of 0.5 to 10 microns formed on the outer surface of the intermediate layer of the titanium oxycarbide, with or without an inner layer of at least one of titanium carbide, titanium nitride, and titanium carbonitride of a thickness of 0.5 to 20 microns interposed between the substrate and the layer of titanium oxycarbide.

According to another aspect of this invention, there is provided a process for producing coated super-hard alloy articles of the above described character.

The nature, utility, and further features of this invention will be more clearly apparent from the following detailed description beginning with a consideration of general aspects of the invention and concluding with specific examples of practice illustrating preferred embodiments of the invention and comparative examples.

BRIEF DESCRIPTION OF THE DRAWINGS

In the accompanying drawings

DETAILED DESCRIPTION

Figure 1:
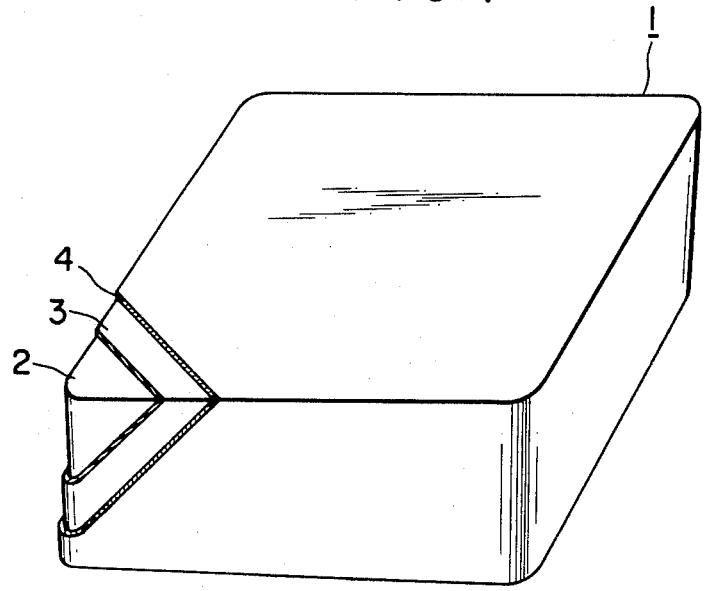
FIG. 1 shows a view of a tip 1 as one embodiment of a coated super-hard alloy article according to the present invention partly cut away whereby a substrate 2, an intermediate layer 3 and outer layer 4 are shown.
Figure 2:
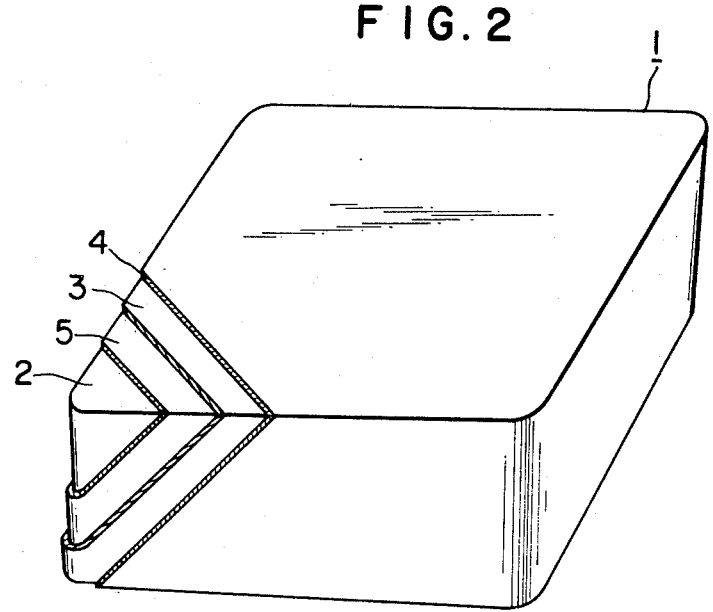
FIG. 2 shows a view of a tip 1 of still another embodiment partly cut away whereby a substrate 2, an inner layer 5, an intermediate layer 3 and an outer layer 4 are shown.
Figure 3:
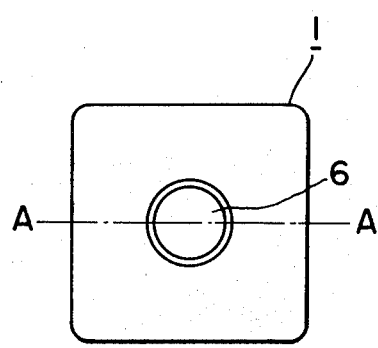
FIG. 3 shows a plan view of another tip 1 having a hole 6.
Figure 5:
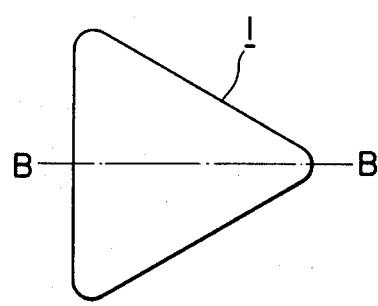
FIG. 5 shows a plan view of still another tip 1.
Figure 4:
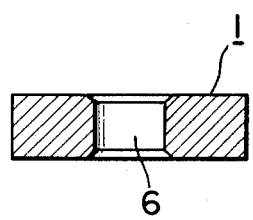
FIG. 4 is a cross-section of the tip 1 of FIG. 3 cut along the line A—A.
Figure 6:
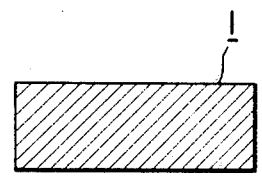
FIG. 6 is a cross-section of the tip of FIG. 6 cut along the line B—B.

The mechanism of the above mentioned reaction for directly forming the $TiC_xO_y$ layer according to this invention is not known in detail, but it may be attributed to the result of the following various reactions which are considered to occur in the reaction chamber or furnace.

$$CO_2 + H_2 \rightleftharpoons CO + H_2O \tag{1}$$

$$TiCl_4 + 2H_2 \rightarrow Ti + 4 HCl \tag{2}$$

$$Ti + \tfrac{1}{2}CO \rightarrow TiC_{0.5}O_{0.5} \tag{3}$$

$$Ti + H_2O \rightarrow TiO + H_2 \tag{4}$$

$$Ti + C \text{ (in substrate)} \rightarrow TiC \tag{5}$$

The proportions of CO and $CO_2$ in the gas mixture is determined by the reversible reaction represented by formula (1), but at high temperatures above 800° C., the equilibrium constant $Kp = P_{CO} \cdot P_{H_2O}/P_{CO_2} \cdot P_{H_2}$ is extremely large, whereby the CO is almost totally dominant and participates in the reaction.

Furthermore, the $H_2O$ formed by the reaction of formula (1) may be thought to form TiO as indicated in formula (4), but, actually, most of the $H_2O$ reacts directly with the $TiCl_4$ in the low-temperature part within the furnace whereby the $TiCl_4$ in converted into an oxide of titanium (TiO, $Ti_2O_3$ and/or $TiO_2$). That is, even if CO gas and $CO_2$ gas are used, substantially the same result will be obtained.

The tendency toward an increase in the carbon content in the formed products as the reaction temperature assumes a high value was observed from the lattice constant measurement. While the above reaction formula (3) indicates the formation of $TiC_{0.5}O_{0.5}$, the carbon content shifts toward higher values on the high-temperature side, there being an equilibrium relationship between the $TiC_xO_y$ and the CO in the gaseous phase, and, for this reason, the reaction resultant may be considered to exhibit this tendency.

The carbon content of titanium oxycarbide can be varied as desired from $TiC_{0.9}O_{0.1}$ to $TiC_{0.4}O_{0.6}$ by varying the gas composition and the reaction temperature.

Furthermore, carbon diffuses from within the super-hard alloy substrate during the reaction, and titanium carbide is produced by the reaction of formula (5), whereby the region in the vicinity of the interface between the coating layer and the substrate assumes a composition of high carbon content. This can be utilized to vary in a continuous manner the carbon concentration beginning from TiC.

The particles forming the coating layer are fine grains and have good crystallinity as determined by X-ray diffraction.

As set forth hereinbefore, this invention provides articles each comprising a super-hard alloy substrate, a coating layer of titanium oxycarbide applied thereon by chemical vapor deposition, and an aluminum oxide layer formed as a further coating on the titanium oxycarbide layer. A titanium oxycarbide is much superior to titanium carbide in wear resistance at the rake face surface in the case where it is applied on a cutting tool, and this superiority becomes pronounced with high-speed cutting. This is attributable to the excellent chemical stability of the titanium oxycarbide at high temperature, particularly oxidation resistance, and to its excellent resistance to reaction with the work material being cut.

On the other hand, a titanium oxycarbide tends to be slightly inferior to titanium carbide in wear resistance at the flank surface. The reason for this is that the principal cause of wear of a flank surface is abrasive wear, and, accordingly, this is inevitable in the case of titanium oxycarbides, which have lower hardnesses than titanium carbide. However, in the above mentioned range of from Ti $C_{0.9}O_{0.1}$ to $TiC_{0.4}O_{0.6}$, this difference is not very great and has no adverse effect in actual practice.

An important feature of this invention is that, because a titanium oxycarbide coated by the aforementioned chemical vapor deposition method has a very good affinity for aluminum oxide, a strong bond can be formed between the two layers, whereby by combining these two coating layers on a super-hard alloy substrate, a coated super-hard alloy article of a high wear resistance which could not be obtained heretofore is produced.

In general, aluminum oxide has excellent heat resistance and wear resistance, and for this reason when it is used to coat tools, it imparts to these tools good wear resistance, particularly at the rake face. However, even this excellent aluminum oxide gives rise to several problems when it is applied as a coating directly on a super-hard alloy. One problem is that, since the super-hard alloy comprising carbides and metal is coated with a substance which is of too different a nature from that of the alloy, the bond between the super-hard alloy and the aluminum oxide is weak, and, furthermore, a brittle layer such as a decarburized layer or an oxidized layer is easily formed in the vicinity of the interface.

Another problem is that, as a result of the difference between the coefficients of thermal expansion of the super-hard alloy and the aluminum oxide, cracks easily occur in the coated layer during cooling after chemical vapor deposition thereof. For this reason, in the case where aluminum oxide is to be applied as a coating directly on the substrate, the substrate is disadvantageously restricted to only super-hard alloys having large contents of TiC and TaC which have coefficients of thermal expansion relatively close to that of aluminum oxide.

In order to overcome these problems, it has been a practice first to coat the substrate with titanium carbide or titanium nitride as a barrier, instead of coating the substrate directly with the aluminum oxide, and then to apply the aluminum oxide coating on the titanium carbide or nitride layer. Cf. Reference (4)

However, according to results of our experiments, this expedient cannot be said to be fully effective. Particularly in the case where a thick layer (4 to 5 microns) of the aluminum oxide is applied in order to elevate the wear resistance, the aluminum oxide easily undergoes crystal growth, and the surfaces of the crystal particles become rough. This contributes to the weakening of the bond between the layers, and a tendency toward separation of the layers during cutting operation was observed. Furthermore, when, in order to prevent this, the surfaces of the titanium carbide or titanium nitride are oxidized, an oxide layer containing as its principal constituent brittle $TiO_2$ of blue color is formed. When aluminum oxide was applied on this oxide layer in one instance, it was found that the crystals of the aluminum readily underwent particle growth, and, when the article was used in cutting operation, a tendency toward peeling from the brittle oxide layer was observed. Thus, this expedient was not effective.

In contrast, when a titanium oxycarbide layer is interposed between the substrate and the aluminum oxide layer according to this invention, this problem is solved, and an ideal composite layer which can fully exhibit and utilize the high wear resistance of aluminum oxide is obtained. More specifically, a titanium oxycarbide is intrinsically a compound containing a considerable quantity of oxygen and is not a compound of uncertain crystalline structure such as that caused to contain oxygen by diffusion of the oxygen from the outside, but is in the form of a layer having high crystallinity and strength which has been formed by chemical vapor deposition. Moreover, its crystal form is the same as those of TiC, TiN, and Ti(CN). Accordingly, a high bonding strength is attained with respect to super-hard alloys as well as titanium carbide, titanium nitride, titanium carbonitride, and aluminum oxide.

It was an interesting discovery that a high bonding strength can be obtained particularly with respect to aluminum oxide. The high value of this bonding strength becomes evident also in the facility of the reaction at the time of the chemical vapor deposition. More specifically, when aluminum oxide was applied as a coating respectively on a super-hard alloy, a titanium carbide coating layer, and a titanium oxycarbide coating layer under the same reaction conditions, the aluminum oxide applied as a coating on the titanium oxycarbide exhibited a tendency to be the thickest and most uniform. Particularly in the case of the other two coatings, their states of coating on their surfaces onto which the vapor or gas had impinged well and those onto which it had not impinged well differed considerably, and the difference in the coating thicknesses was quite distinct.

In contrast, the coating over the titanium oxycarbide was uniform. This is attributable to the advantageous action of the oxygen in the titanium oxycarbide on the formation of the crystal nuclei and other actions and effects during the evaporation deposition of the aluminum oxide. Since the titanium oxycarbide, itself, has a high wear resistance, it is possible by combining aluminum oxide therewith to obtain a combined coating layer of excellent wear resistance.

Furthermore, by interposing a titanium oxycarbide layer according to this invention, it has become possible to apply a thick and uniform coating of aluminum oxide in a strongly bonded state on super-hard alloys coated with titanium carbide, titanium nitride, or titanium carbonitrides which has been used in the prior art. A multilayer coated super-hard alloy is an article having high wear resistance in which the unique and advantageous features of each layer are fully utilized.

More specifically, a throw-away tip coated with a titanium carbide layer has a low wear resistance at its rake face in comparison with that at its flank. For this reason, when the throw-away tip is used in high-speed cutting, in spite of the extremely small wear at the flank, wear occurs at the rake face and gives rise to a plastic deformation of the cutting edge, by which the serviceable life of the tool is terminated. This is reported in Reference (5).

In the laminated layer arrangement illustrating the second embodiment of this invention, wherein aluminum oxide is applied as a coating over a titanium carbide coating layer with a titanium oxycarbide layer interposed therebetween, the high wear resistance at the flank of the titanium carbide underlayer is utilized, and the weak point of the titanium carbide coating, which is the relatively low wear resistance at the rake face in highspeed cutting, is compensated for, whereby excellent wear resistance at both the rake face and the flank is attained. This effect is similarly attainable also with sub-coatings of titanium nitride and titanium carbonitride.

A suitable thickness of the titanium oxycarbide layer is of the order of 0.5 to 20 microns in the case where it is applied as a coating on a super-hard alloy substrate, that is, in the first embodiment of this invention. We have found that when this thickness is less than 0.5 micron, the effect of the layer on improving the wear resistance is small, while thickness greater than 20 microns is undesirable since it gives rise to a lowering of the toughness of the tool. The thickness is preferably of the order of 0.5 to 10 microns.

A suitable thickness of the titanium oxycarbide layer is of the order of 0.5 to 10 microns in the case where it is applied as a coating on a layer of titanium carbide, nitride or carbonitride on the super-hard alloy substrate, namely, in the second embodiment of this invention. These limits are determined for the same reasons as stated above. The preferable thickness is of the order of 0.5 to 5 microns.

A suitable thickness of the aluminum oxide is 0.5 to 10 microns, these limits being determined for the same reasons as stated above for the thickness of the titanium oxycarbide layer. The thickness is preferably of the order of 0.5 to 5 microns.

Furthermore, when an inner layer is to be used, suitable thicknesses of the titanium carbide, the titanium nitride, and the titanium carbonitride are 0.5 to 20 microns, preferably 0.5 to 10 microns, the reasons for these limits being the same as those for the aluminum oxide.

The substrate of a coated super-hard alloy article according to this invention comprises (1) at least one of carbides, nitrides, and carbonitrides of metals of Groups 4a, 5a, and 6a of the periodic table and (2) at least one of Fe, Ni, Co, W, Mo, and Cr. Typical metals of the above group (1) are Ti, Zr, Hf, V, Nb, Ta, Cr, Mo, and W. A super-hard alloy of this character is known and is disclosed in, for example, R. Kieffer: "Hartmetalle", Springer-Verlag (Wien-NY), 1965. Examples of these alloys suitable for use in this invention are WC-TiC-TaC-Co alloy, WC-Co alloy, WC-TiC-Co alloy, WC-TiC-TaC-NbC-Co alloy, WC-TiC-$Mo_2C$-Ni-Co alloy, and TiC-Mo-Ni alloy. These super-hard alloys can be produced by known processes, such as, for example, a process comprising mixing powder of starting materials, pressing the mixture into a preform and sintering the perform.

The coating of a super-hard alloy of this character in one mode of practice of this invention with titanium carbide, titanium nitride and/or titanium carbonitride can be carried out by any appropriate process, such as, for example, chemical vapor deposition wherein a mixture of $TiCl_4$, $H_2$ and $CH_4$ and/or $N_2$ is passed over a substrate under heat to thereby produce on a surface of the substrate titanium carbide, nitride and/or carbonitride.

The chemical vapor deposition of a titanium oxycarbide on the coating applied in this manner, or directly on the super-hard substrate, can be carried out by causing a gaseous phase mixture of (1) a halide of titanium, particularly a halide vaporizing under the chemical vapor deposition condition of 800° to 1,200° C. such as, for example, $TiCl_4$, $TiBr_4$ or $TiI_4$, (2) hydrogen, and (3) CO and/or $CO_2$ to contact the objective metal surface at a temperature of 800° to 1,200° C., preferably 900° to 1,100° C., thereby to cause a titanium oxycarbide to precipitate on this metal surface.

The aluminum oxide layer to be applied on the titanium oxycarbide layer deposited in this manner can be applied by an ordinary process. For example, a gaseous mixture containing an aluminum halide, e.g., $AlCl_3$, for example, a gaseous mixture with $CO_2$ and $H_2$, can be heated to a temperature at which this aluminum halide decomposes to produce aluminum oxide, e.g., 800° to 1,200° C., and caused to contact the surface of the above mentioned titanium oxycarbide layer to thereby precipitate the aluminum oxide.

The coated super-hard alloy articles according to this invention can be applied to the same uses as those of conventional coated super-hard alloy articles. As one example, the articles of this invention can be applied to tips for cutting, particularly throw-away chips. It will be evident that, in addition, the articles of this invention can be applied to various applications wherein the wear resistance and other properties thereof can be fully exhibited and utilized.

In order to indicate more fully the nature and utility of this invention, the following specific examples of practice illustrating preferred embodiments of the invention are set forth, it being understood that these examples are presented as illustrative only and that they are not intended to limit the scope of the invention. Throughout these examples, quantities given in the unit of percent are by weight.

EXAMPLE 1

For the substrate, a super-hard alloy comprising 80 percent of WC, 10 percent of Co, 8 percent of TiC, and 2 percent of TaC (ISO Standards P 30 grade) was used. This alloy was heated to 950° C. in a reaction vessel made of a heat-resistant alloy.

A reaction gas mixture comprising 2 percent of $TiCl_4$, 1 percent of CO, and 97 percent of $H_2$ was charged into the reaction vessel at a flow rate of 10 liters/min., and reaction was carried out for 3 hours thereby to coat the substrate with a titanium oxycarbide.

Then, after the residual gases were removed with hydrogen gas, further coating with aluminum oxide was carried out under the following conditions.

Reaction gas composition

| $AlCl_3$ | 2% |
|---|---|
| $CO_2$ | 3% |
| $H_2$ | 95% |
| Reaction temperature | 1,000° C. |
| Gas flow rate | 10 liters/min. |
| Reaction time | 1 hour |

The coating layers of the coated super-hard alloy thus obtained comprised an intermediate layer of the titanium oxycarbide of 5-micron thickness and an outer layer of aluminum oxide of 2-micron thickness. The bonding strengths between the super-hard alloy substrate, the titanium oxycarbide, and the aluminum oxide were found to be good. As a result of measurement of the lattice constant by X-ray diffraction analysis, it was found that the composition of the titanium oxycarbide of the intermediate layer was $TiC_{0.6}O_{0.4}$, and that the aluminum oxide of the outer layer was $\alpha$-$Al_2O_3$.

EXAMPLE 2

A titanium oxycarbide was applied as a coating layer on the surface of a super-hard alloy of ISO P30 grade as a substrate by the procedure set forth in Example 1. The reaction compositions were as follows. Reaction gas composition

| $TiCl_4$ | 2% |
|---|---|
| $CO_2$ | 0.5% |
| CO | 0.5% |
| $H_2$ | 97% |
| Reaction temperature | 1,050° C. |
| Gas flow rate | 10 liters/min. |
| Reaction time | 3 hours |

Then, by the procedure described in Example 1, aluminum oxide was applied as a coating.

As a result of an examination of the structure of the resulting article, it was found that the coating comprised an intermediate layer of the titanium oxycarbide of a thickness of 5 microns and an outer layer of aluminum oxide of 2-micron thickness. As a result of a lattice constant measurement of the titanium oxycarbide, it was found that its structure was $TiC_{0.7}O_{0.3}$.

EXAMPLE 3

The substrate of Example 1 was coated with a layer of TiC of 3-micron thickness, and then, under the conditions set forth in Example 1 (except for a reaction time of 1.5 hours), a titanium oxycarbide coating of 2-micron thickness was applied on the TiC layer, whereby a coating of a total thickness of 5 microns was obtained. Three kinds of super-hard alloy articles, namely, the alloy with this double-layer coating, the super-hard alloy coated with a layer of TiC of 5-micron thickness, and the super-hard layer alloy coated with a TiN layer of 5-micron thickness were simultaneously coated with aluminum oxide under the same coating conditions as in Example 1.

As a result, the article of this invention with the aluminum oxide coating on the double-layer coating was found to have the aluminum oxide coated uniformly with a thickness of 2 microns, whereas the aluminum oxide layers on the TiC layer and the TiN layer were of an average thickness of 1.2 microns and had deviations in thickness at the edge portions and central portions of the surfaces of their super-hard alloy substrates, the thickness at the thickest part of the edge portions being 2.0 microns, and that at the thinnest part of the central portions being 0.5 micron.

EXAMPLE 4

Similarly as in Example 3, a P 30 grade super-hard alloy coated with 4-micron layer of TiC was used, and the surface thereof was coated with a titanium oxycarbide under the reaction conditions of Example 1 except for a reaction time of 45 minutes. Then, after the residual gases in the reaction furnace were removed with hydrogen, the article was coated with aluminum oxide under the same conditions as in Example 1.

The coating thus obtained was found to have a 1-micron layer of the titanium oxycarbide ($TiC_{0.6}O_{0.4}$) over the TiC layer and further thereover an aluminum oxide layer of 2-micron thickness, and the bonding strength was found to be good.

EXAMPLE 5

A super-hard alloy of P 30 grade coated with a 4-micron layer of TiN was used as a substrate to carry out an experiment under the same conditions as in Example 4.

The coated super-hard alloy thus obtained had a 1-micron layer of the titanium oxycarbide ($TiC_{0.6}O_{0.4}$) over the TiN layer of 4-micron thickness and further thereover a 2-micron layer of aluminum oxide. The bonding strength was good.

EXAMPLE 6

A super-hard alloy of P 30 grade coated with a 2-micron layer of TiC was used as a substrate, which was further coated with a 1-micron layer of $TiC_{0.6}O_{0.4}$ under the conditions of Example 4. This coated alloy and a super-hard alloy of P 30 grade coated with a 3-micron layer of TiC were respectively coated with aluminum oxide under the conditions set forth in Example 1 except for a reaction time of 2 hours.

As a result, the former coated alloy was found to have a coating comprising a 2-micron layer of TiC, a 1-micron layer of the $TiC_{0.6}O_{0.4}$, and a 4-micron layer of $Al_2O_3$, while the latter coated alloy had a coating comprising a 3-micron layer of TiC and a 3.5-micron layer of $Al_2O_3$. When indentations were made with a Rockwell indentator on these coated alloys, the alloy with the intermediate layer of $TiC_{0.6}O_{0.4}$ did not exhibit any separation of layers, but the alloy without this intermediate layer was found to have a separation of the TiC and $Al_2O_3$ layers at the interface therebetween.

EXAMPLE 7

The coated articles obtained respectively in the foregoing Examples 1, 2, 4, 5, and 6 were subjected to cutting tests. As comparative examples, a P 30 grade super-hard alloy which was the same as the one used as the substrate in the foregoing Examples, and samples of this alloy coated respectively with TiC and TiN, were used.

The conditions and results of these cutting tests were as follows.

Cutting Example 1

Continuous cutting of cast iron FC-25 $H_B$ 180
V=200 meters/min., f=0.2 mm./rev. t=1.5 mm.

| Sample | Coating layer (s) | Life* (min.) |
| --- | --- | --- |
| Comparative Example | | |
| 1 | P 30 (no coating layer) | 2 |
| 2 | TiC, 7μ | 23 |
| 3 | TiN, 7μ | 25 |
| 4 | TiC, 3μ + $Al_2O_3$, 4μ | 12 |
| Example | | |
| 1 | $TiC_{0.6}O_{0.4}$,5μ + $Al_2O_3$, 2μ | 70 |
| 2 | $TiC_{0.7}O_{0.3}$,5μ + $Al_2O_3$, 2μ | 67 |
| 4 | TiC, 4μ + $TiC_{0.6}O_{0.4}$, 1μ + $Al_2O_3$, 2μ | 53 |
| 5 | TiN, 4μ + $TiC_{0.6}O_{0.4}$, 1μ + $Al_2O_3$, 2μ | 57 |
| 6 | TiC, 2μ + $TiC_{0.6}O_{0.4}$, 1μ + $Al_2O_3$, 4μ | 70 |

*A rake face wear of 200 microns (μ) or a flank wear of 0.4 mm. was taken as the life limit.

The $Al_2O_3$ layer of the Comparative Example 4 separated during cutting, and abnormal wear occurred. The articles of this invention all exhibited a life extension of 2 to 3 times.

Cutting Example 2

Cutting of carbon steel S 30C, $H_B$ 210
V=180 meters/min, f=0.2 mm./rev., t=1.5 mm.

| Sample | Coating layer | Life* (min.) |
| --- | --- | --- |
| Comparative Example | | |
| 1 | P 30 (no coating layer) | 10 |
| 2 | TiC, 7μ | 21 |
| 3 | TiN, 7μ | 18 |
| 4 | TiC, 3μ + $Al_2O_3$, 4μ | 20 |
| Example | | |
| 1 | $TiC_{0.6}O_{0.4}$, 5μ + $Al_2O_3$, 2μ | 61 |
| 2 | $TiC_{0.7}O_{0.3}$, 5μ + $Al_2O_3$, 2μ | 65 |
| 4 | TiC, 4μ + $TiC_{0.6}O_{0.4}$, 1μ + $Al_2O_3$, 2μ | 58 |
| 5 | TiN, 4μ + $TiC_{0.6}O_{0.4}$, 1μ + $Al_2O_3$, 2μ | 53 |
| 6 | TiC, 2μ + $TiC_{0.6}O_{0.4}$, 1μ + $Al_2O_3$, 4μ | 53 |

*Same as in Cutting Example 1.

The $Al_2O_3$ of the flank of the Comparative Example 4 separated during cutting, and wear progressed therefrom.

The references cited above are as follows.
(1) H. Nishimura and H. Kimura, Nippon Kinzoku Gakkai Si (J. Japan Inst. Met.) No. 10, 1956, p. 589.

(2) W. Carson, N. Cook, et al: "Enhancement of Tungsten Carbide Tool Properties", Annual Progress Report to NSF, NTIS GK 29379 (1973).
(3) W. Carson, C. Leung, N. Suh, Annals of the CIRP, vol. 23, 1, 1974.
(4) Japanese Pat. Laid-open No. 59106/1973.
(5) H. Negishi, N. Kobayashi, Y. Karino: "Study on mechanism of wear of surface coated super-hard alloys", preprints for the Spring Convention of 1976 of Seiki Gakkai (Precision Machinery Inst.).

We claim:

1. A coated super-hard alloy article consisting of a substrate and two layers as follows: a substrate of a super-hard alloy comprising at least one member selected from the group consisting of carbides, nitrides, and carbonitrides of metals of Groups 4a, 5a, and 6a, of the periodic table and at least one member selected from the group consisting of Fe, Ni, Co, W, Mo, and Cr; an intermediate, crystalline layer of a titanium oxycarbide as determined by X-ray diffraction, of the formula of from $TiC_{0.9}O_{0.1}$ to $TiC_{0.4}O_{0.6}$ formed with a thickness of 0.5 to 10 microns on the surface of the substrate by reacting thereon, at a temperature of 800° to 1,200° C., a halide of titanium, hydrogen, and a member selected from the group consisting of carbon monoxide, carbon dioxide, and mixtures of carbon monoxide and carbon dioxide; and an outer coating layer of aluminum oxide formed with a thickness of 0.5 to 5 microns on the outer surface of the intermediate layer.

2. A coated super-hard alloy article as claimed in claim 1 in which the substrate comprises WC, Co, TiC, and TaC.

3. A coated super-hard alloy article consisting of a substrate and three layers as follows: a substrate of a super-hard alloy comprising at least one member selected from the group consisting of carbides, nitrides, and carbonitrides of metals of Groups 4a, 5a, and 6a of the periodic table and at least one member selected from the group consisting of Fe, Ni, Co, W, Mo, and Cr; an inner layer consisting of at least one member selected from the group consisting of titanium carbide, titanium nitride and titanium carbonitride formed with a thickness of 0.5 to 10 microns on the surface of the substrate; an intermediate, crystalline layer of a titanium oxycarbide as determined by X-ray diffraction, of the formula of from $TiC_{0.9}O_{0.1}$ to $TiC_{0.4}O_{0.6}$ formed with a thickness of 0.5 to 5 microns on the outer surface of the inner layer by reacting thereon, at a temperature of 800° to 1,200° C., a halide of titanium, hydrogen, and a member selected from the group consisting of carbon monoxide, carbon dioxide, and mixtures of carbon monoxide and carbon dioxide; and an outer coating layer of aluminum oxide formed with a thickness of 0.5 to 5 microns on the outer surface of the intermediate layer.

4. A coated super-hard alloy article as claimed in claim 3 in which the substrate comprises WC, Co, TiC, and TaC.

* * * * *